(12) United States Patent
Schuppe et al.

(10) Patent No.: US 9,570,157 B1
(45) Date of Patent: Feb. 14, 2017

(54) DYNAMIC CAPACITANCE BALANCING

(71) Applicant: ARM Limited, Cambridge (GB)

(72) Inventors: Vincent Philippe Schuppe, Austin, TX (US); Sushil Kumar, Austin, TX (US); Daksheshkumar Maganbhai Malaviya, Bangalore (IN); Hemant Hemraj Parate, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/011,042

(22) Filed: Jan. 29, 2016

(30) Foreign Application Priority Data

Aug. 27, 2015  (IN) ............................ 4505/CHE/2015

(51) Int. Cl.
   *G11C 7/00*     (2006.01)
   *G11C 11/419*   (2006.01)
(52) U.S. Cl.
   CPC .................................. *G11C 11/419* (2013.01)
(58) Field of Classification Search
   CPC .................................................. G11C 11/419
   USPC ..................................................... 365/189.15
   See application file for complete search history.

(56) References Cited

U.S. PATENT DOCUMENTS

2006/0291312 A1*  12/2006  Forbes .................... H03F 1/08
                                                365/206
2012/0182056 A1*  7/2012  Dally ............... H03K 3/356139
                                                327/202

* cited by examiner

*Primary Examiner* — Hoai V Ho
(74) *Attorney, Agent, or Firm* — Pramudji Law Group PLLC; Ari Pramudji (57) ABSTRACT

Various implementations described herein are directed to a device for dynamic capacitance balancing. The device may include a sense amplifier configured to receive complimentary data signals from complimentary bitlines and provide first and second sensed data signals based on received complimentary data signals. The second sensed data signal may be a compliment of the first sensed data signal. The device may include a balance coupler configured to receive the second sensed data signal from the sense amplifier and provide a modified second sensed data signal having capacitance similar to the first sensed data signal. The device may include a latch configured to receive the first sensed data signal from the sense amplifier, receive the modified second sensed data signal from the balance coupler, and provide a latched data signal based on the first and modified second sensed data signals.

20 Claims, 9 Drawing Sheets

(PRIOR ART)

DYNAMIC CAPACITANCE BALANCING

CROSS-REFERENCE TO RELATED APPLICATIONS

This application claims the benefit of and priority to Indian Patent Application Number 4505/CHE/2015, filed 2015 Aug. 27 and titled DYNAMIC CAPACITANCE BALANCING, the entire disclosure of which is incorporated herein by reference.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Figure 1:
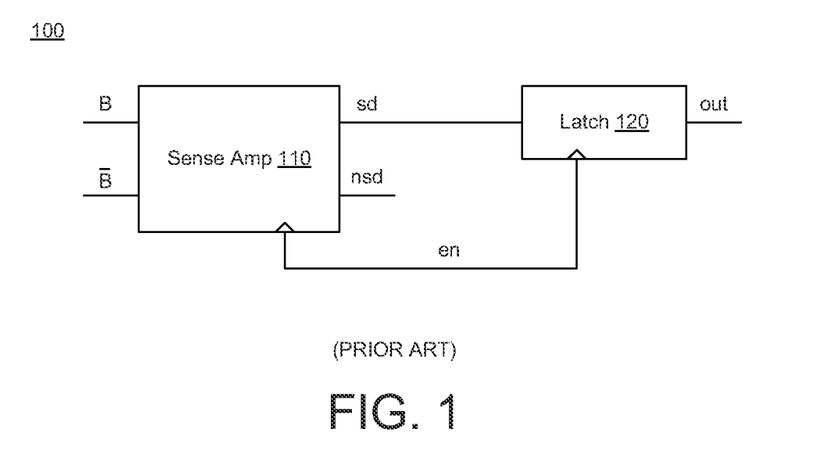
FIG. 1 illustrates a diagram of sense amplifier circuitry as known in the art.

Integrated circuits typically include circuitry to perform data access functions to assist with read operations. For instance, a Static Random Access Memory (SRAM) read may require a dual-rail, differential voltage read by a sense amplifier followed by a singled-ended latch. While it is desirable to reduce a physical mismatch of a sense amplifier, it is also desirable to optimize output of the sense amplifier or other effect that is systematic to the design. For instance, FIG. 1 shows an example of conventional sense amplifier circuitry 100 having a sense amplifier 110 and a latch 120 that are arranged to receive a dual-rail, differential voltage (B and $\overline{B}$) and output a singled-ended voltage (out). In common practice, as shown in FIG. 1, a first sense amplifier output (sd) is typically coupled to an input of the single-ended latch 120. In some cases, this arrangement may optimize memory area; however, this arrangement may create a rather substantial systematic offset. Further, in common practice, as shown in FIG. 1, a second sense amplifier output (nsd) is typically left without any coupling or connection, which will create unbalanced capacitance output from the sense amplifier 110 and will not provide a similar coupling effect for nsd output when compared to sd output. As such, there exists a need for more effective sense amplifier circuitry that improves power, performance and area (PPA) of an integrated circuit.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 2-10B illustrate diagrams of sense amplifier circuitry in accordance with various implementations described herein.

DETAILED DESCRIPTION

Various implementations described herein refer to and are directed to sense amplifier circuitry for providing improved PPA and improved yield through systematic offset reduction. Further, various implementations described herein refer to and are directed to sense amplifier circuitry for reducing systematic offset by dynamic capacitance balancing to improve PPA. Accordingly, various implementations described herein may provide for cancelling (or at least reducing) systematic offset to improve yield and/or speed of memory, without impact on area of memory, or with reducing area of memory.

Various implementations of sense amplifier circuitry will now be described in more detail with reference to FIGS. 2-10B.

Figure 2:
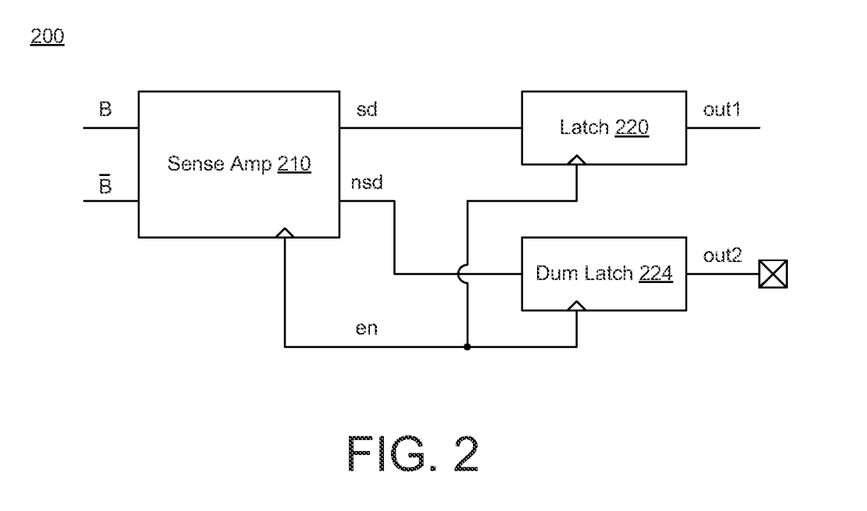

FIG. 2 illustrates a diagram of sense amplifier circuitry 200 in accordance with various implementations described herein. As shown in FIG. 2, sense amplifier circuitry 200 may be implemented as an integrated circuit with multiple stages. The multiple stages may be referred to as sub-divided circuit portions with interdependent relationships.

The sense amplifier circuitry 200 may include a sense amplifier 210 coupled to complimentary bitlines B and $\overline{B}$. The sense amplifier 210 may be configured to receive complimentary data signals from the complimentary bitlines B, $\overline{B}$ and provide first and second sensed data signals sd, nsd, respectively, based on the received complimentary data signals. The second sensed data signal nsd may be a compliment of the first sensed data signal sd, and each of the first and second sensed data signals sd, nsd may have a capacitance associated therewith. Further, the sense amplifier 210 may be configured to provide an enable signal (en) to latches 220, 224, and latches 220, 224 may be configured to receive the enable signal (en) from the sense amplifier 210. The enable signal (en) may be referred to as a sense amp enable signal (sae).

In some implementations, the sense amplifier 210 may be coupled to a memory cell (not shown) and may be configured to receive complimentary data signals from the memory cell via the complimentary bitlines B, $\overline{B}$. The complimentary data signals may represent data bit values stored in the memory cell. The memory cell may refer to a static random access memory (SRAM) cell. The complimentary data signals may include a first complimentary data signal representing a data bit value and a second complimentary data signal representing a compliment of the data bit value.

The sense amplifier circuitry 200 may include a first latch 220 coupled to the sense amplifier 210. The first latch 220 may be configured to receive the first sensed data signal sd from the sense amplifier 210 and provide a first latched data signal (out1) based on the first sensed data signal sd.

The sense amplifier circuitry 200 may also include a second latch 224 coupled to the sense amplifier 210. The second latch 224 may be referred to as a dummy latch. The second latch 224 may be configured to receive the second sensed data signal nsd from the sense amplifier 210 and provide a second latched data signal (out2) based on second sensed data signal nsd. The second latched data signal (out2) may have capacitance similar to the first sensed data signal sd. As shown in FIG. 2, the second latched data signal (out2) may be left open and not be coupled to any other circuit element.

In some implementations, this configuration of sense amplifier circuitry 200 of FIG. 2 may describe an improved design in terms of capacitance as the second sensed data signal nsd may receive or get a same loading capacitance as the first sensed data signal sd. However, this configuration of sense amplifier circuitry 200 of FIG. 2 may not be free of systematic offset, as the coupling effect may be missing. Also, this configuration of sense amplifier circuitry 200 of FIG. 2 may be inefficient in reference to using more area due to incorporation of the dummy second latch 224. In any event, improvements to this configuration are described in greater detail herein.

Figure 3:
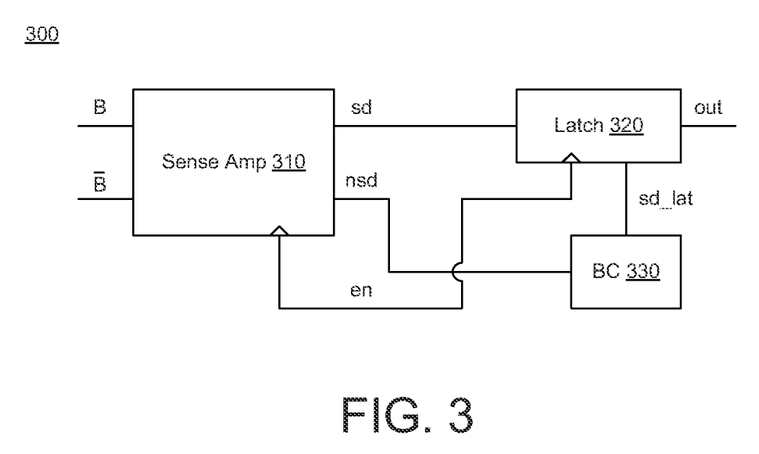

FIG. 3 illustrates a diagram of sense amplifier circuitry 300 in accordance with various implementations described herein. As shown in FIG. 3, sense amplifier circuitry 300 may be implemented as an integrated circuit with multiple stages and may be referred to as a dynamic capacitance balancing circuit device. The multiple stages may be referred to as multiple sub-divided circuit portions having interdependent relationship.

The sense amplifier circuitry 300 may include a sense amplifier 310 coupled to the complimentary bitlines B and $\overline{B}$. The sense amplifier 310 may be configured to receive complimentary data signals from the complimentary bitlines B, $\overline{B}$ and provide first and second sensed data signals sd, nsd, respectively, based on the received complimentary data signals. The second sensed data signal nsd may be a compliment of the first sensed data signal sd, and each of the first and second sensed data signals sd, nsd may have a capacitance associated therewith. Further, the sense amplifier 310 may be configured to provide an enable signal (en) to latch 320, and the latch 320 may be configured to receive the enable signal (en) from the sense amplifier 310.

In some implementations, the sense amplifier 310 may be referred to as a differential sense amplifier having differential inputs, such as, e.g., complimentary bitlines B and $\overline{B}$. In some cases, the sense amplifier 310 may be enabled only when a sufficient voltage difference is available at the differential inputs.

In some implementations, the sense amplifier 310 may be coupled to a memory cell (not shown) and may be configured to receive the complimentary data signals from the memory cell via the complimentary bitlines B, $\overline{B}$. The complimentary data signals may represent data bit values stored in the memory cell. The memory cell may refer to an SRAM cell or other similar memory cell. The complimentary data signals may include a first complimentary data signal representing a data bit value and a second complimentary data signal representing a compliment of the data bit value.

The sense amplifier circuitry 300 may include a balance coupler 330 coupled to the sense amplifier 310. The balance coupler 330 may be configured to receive the second sensed data signal nsd from the sense amplifier 310 and then provide a modified second sensed data signal sd_lat having capacitance similar to the first sensed data signal sd. In some implementations, the balance coupler 330 may be configured to compensate for systematic offset due to capacitance mismatch between the differential inputs (e.g., bitlines B and $\overline{B}$) of the complimentary data signals by providing capacitance matching between the differential inputs (e.g., bitlines B and $\overline{B}$) of the complimentary data signals. Systematic offset generally refers to a function of mismatch between capacitance and coupling of differential inputs and or outputs of the sense amplifier 310. According to implementations described herein, the balance coupler 330 may be configured to adjust the capacitance of the second sensed data signal nsd and provide the modified second sensed data signal sd_lat with capacitance and coupling similar to first sensed data signal sd. These techniques related to dynamic capacitance balancing of this capacitance mismatch are described in greater detail below with reference to the drawings.

As mentioned above, the sense amplifier circuitry 300 may include the latch 320 coupled to the sense amplifier 310 and the balance coupler 330. The latch 320 may be configured to receive the first sensed data signal sd from the sense amplifier 310, receive the modified second sensed data signal sd_lat from the balance coupler 330, and provide a latched data signal (out) based on the first sensed data signal sd and the modified second sensed data signal sd_lat. In this manner, the latch 320 may be configured with a dual input to receive sd and sd_lat and a single output to provide the latched data output signal (out).

In some implementations, this configuration of sense amplifier circuitry 300 of FIG. 3 describes an improved design in terms of capacitance and in some cases area reduction to thus provide improved PPA. Accordingly, this configuration of sense amplifier circuitry 300 of FIG. 3 provides a reduced block replacing the dummy second latch 224 of FIG. 2 with the balance coupler 330, which may allow systematic offset cancellation, along with area reduction. As described herein, the latch 320 of FIG. 3 may be configured to use the modified second sensed data signal sd_lat received from the balance coupler 330 to provide a balance coupling effect in reference to both the first and second sensed data signals sd, nsd. To achieve this balanced coupling effect, the balance coupler 330 may be configured to replicate Miller capacitance effects from sd to nsd, e.g., using same signals or similar signals, with same gate sizes.

Figure 4:
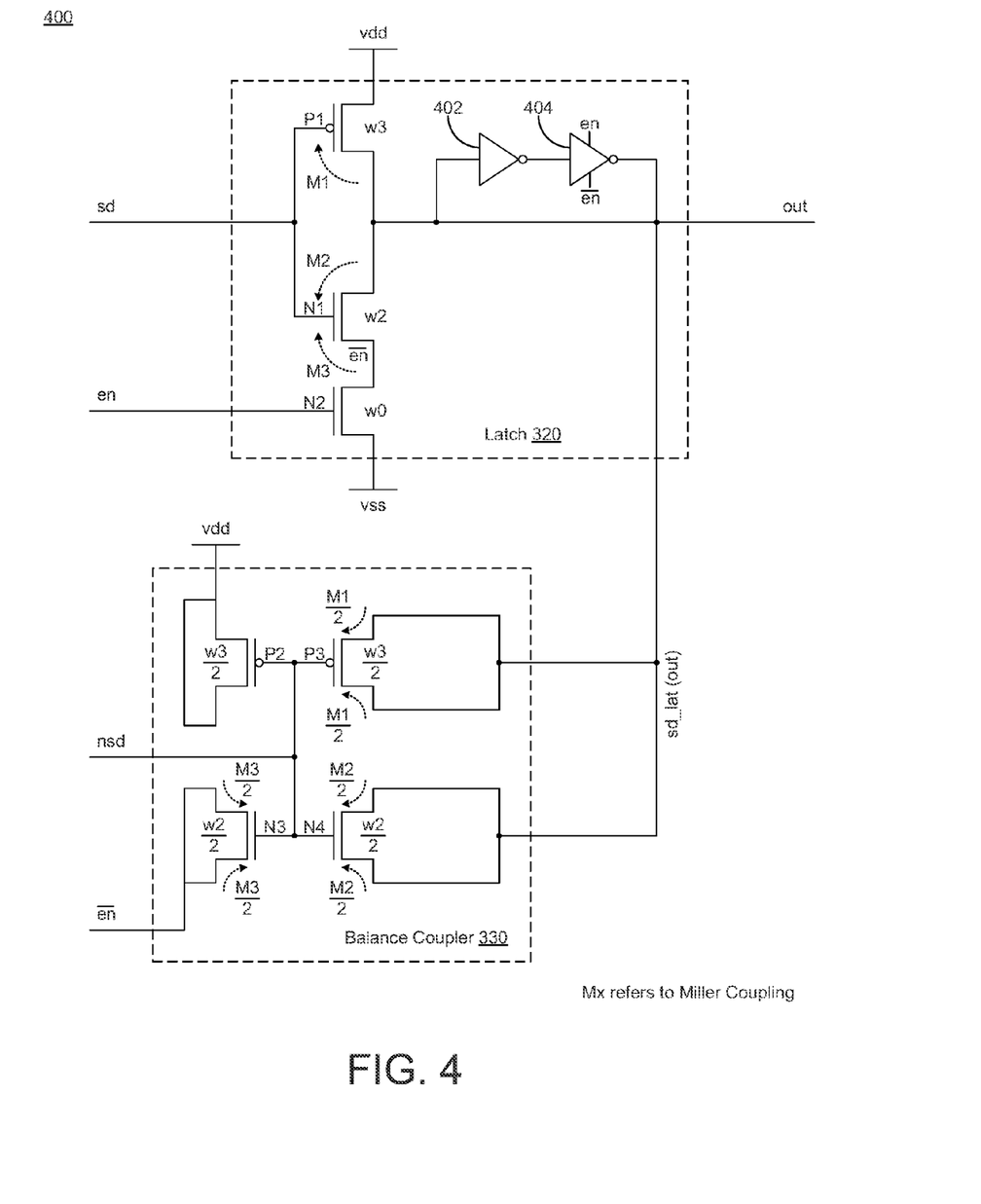

FIG. 4 illustrates a schematic diagram 400 of more detailed portions of the sense amplifier circuit 300 of FIG. 3 (e.g., the latch 320 and the balance coupler 330) in accordance with various implementations described herein. As shown in FIG. 4, the sense amplifier circuit 300 of FIG. 3 may be implemented as an integrated circuit with multiple stages and with multiple circuit components, such as, e.g., multiple transistors arranged to perform the various techniques described herein. Further, as previously described herein, the multiple stages may be referred to as multiple sub-divided circuits or circuit portions having interdependent relationships.

As shown in FIG. 4, the latch 320 may include multiple transistors arranged to receive the first sensed data signal sd and provide (or output) the latched data signal (out) based on the first sensed data signal sd and the modified second sensed data signal sd_lat. The first sensed data signal sd has a first capacitance, and the second sensed data signal nsd has a second capacitance that may be different than the first capacitance. As described herein, a goal of the balance coupler 330 is to balance the capacitance of nsd to match the capacitance of sd.

In various implementations, the latch 320 may include multiple Metal-Oxide-Semiconductor (MOS) transistors including a combination of P-type MOS (PMOS) and N-type MOS (NMOS) transistors. For instance, the latch 320 may include PMOS transistor P1 (having width w3) coupled to a first voltage source vdd. The latch 320 may include NMOS transistor N1 (having width w2) coupled between PMOS transistor P1 and another NMOS transistor N0. The latch 320 may include the NMOS transistor N0 (having width w0) coupled between NMOS transistor N1 and another voltage source vss, such, e.g., ground (GND). The latch 320 is configured to receive and apply the first sensed data signal sd to a gate of each of PMOS transistor P1 and NMOS transistor N1. The latch 320 is further configured to receive and apply the voltage source signal vdd to PMOS transistor P1. In this arrangement, the voltage source signal vdd is provided to the output path (out) via the PMOS transistor P1 based on the first sensed data signal sd. The latch 320 is further configured to receive and apply the enable signal (en) to a gate of NMOS transistor N2. Further, the latch 320 may include logic devices 402, 404 (e.g., one or more inverters or other similar logic devices) arranged in parallel with the output path of the output signal (out). In various implementations, w3, w2, w0 refer to a width or size of each corresponding transistor P1, N1, N2, respectively.

In reference to FIG. 4, Mx refers to Miller capacitance coupling effects. In this instance, during operation, a first Miller capacitance M1 appears at PMOS transistor w3, a second Miller capacitance M2 appears at a signal input to NMOS transistor w2, and a third Miller capacitance M3 appears at a signal output from NMOS transistor w2. As such, the output signal (out) of the latch 310 has a first capacitance based, at least in part, on the Miller capacitances M1, M2, M3 of the transistors w2, w3.

As shown in FIG. 4, the balance coupler 330 may include multiple transistors arranged to receive the second sensed data signal nsd and balance the capacitance of the second sensed data signal nsd. For instance, the capacitance of the second sensed data signal nsd is balanced to match the capacitance (i.e., first capacitance) of the first sensed data signal sd so that the modified second sensed data signal sd_lat has a capacitance similar to (or the same as) the first sensed data signal sd. In some implementations, the modified signal sd_lat may be considered as an output from latch 320 and an input from balance coupler 330.

In some implementations, the balance coupler 330 is configured to compensate for dynamic capacitance imbalance between the first and second sensed data signals (e.g., as received via complementary bitlines B and $\overline{B}$) by replicating Miller capacitance (Mx) effects of the first sensed data signal sd to the second sensed data signal nsd. The compensated signal sd_lat has a capacitance balanced to match the capacitance of the first sensed data signal sd. For instance, as shown in FIG. 4, the balance coupler 330 may include multiple transistors arranged as one or more capacitors. Generally, as described herein, Mx refers to Miller capacitance coupling effects.

In various implementations, the balance coupler 330 may include multiple MOS transistors including a combination of PMOS and NMOS transistors. For instance, the balance coupler 330 may include two PMOS transistors having a width w3/2 with a first PMOS transistor P2 (having width w3/2) coupled as a capacitor to first voltage source vdd and a second PMOS transistor P3 (having a width w3/2) coupled as a capacitor to the output path (out). Further, the balance coupler 330 may include two NMOS transistors having a width w2/2 with a first NMOS transistor N3 (having a width w2/2) coupled as a capacitor to a compliment ($\overline{en}$) of the enable signal (en) and a second NMOS transistor N4 (having a width w2/2) coupled as a capacitor to the output path (out). Further, the balance coupler 330 may be configured to receive and apply the second sensed data signal nsd to a gate of each of the PMOS transistors P2, P3 and a gate of each of the NMOS transistors N3, N4.

During operation, the balance coupler 330 may be configured to compensate for dynamic capacitance imbalance between the first and second sensed data signals sd, nsd by replicating Miller capacitance (Mx) effects of the first sensed data signal sd to the second sensed data signal nsd. As such, during operation, the first Miller capacitance M1 of the latch 310 may be replicated with the combination of two Miller capacitances M1/2 (i.e., 2*M1/2=M1) appearing at the two PMOS transistors P2, P3. Further, the second Miller capacitance M2 of the latch 320 may be replicated with the combination of two Miller capacitances M2/2 (i.e., 2*M2/2=M2) appearing at the two NMOS transistors N3, N4. As such, the output signal (sd_lat) of the balance coupler 330 may have a replicated first capacitance similar to the first capacitance based, at least in part, on the combination of Miller capacitances M2/2, M3/3 of the transistors P2, P3, N3, N4. Accordingly, as described herein, the balance coupler 330 may be configured to receive second sensed data signal nsd and balance capacitance of second sensed data signal nsd to match the capacitance of first sensed data signal sd so as to provide the modified second sensed data signal sd_lat with capacitance similar to the first sensed data signal sd.

In some implementations, the supply voltage vdd may be configured to provide an input voltage of approximately 1.2V. In other implementations, the supply voltage vdd may be configured to provide an input voltage within a range of approximately 0.3V to 1.5V. In still other implementations, the supply voltage vdd may be configured to provide an input voltage within a range of approximately >0V to 3.3V. As described herein, each stage may be configured to utilize one or more circuit components that may be configured for operating together to perform brown-out detection. Further, in some implementations, the supply voltage vdd may not be less than about 1.0V, e.g., when using a thick-gate transistor, because the circuit may be configured to trip when the source voltage vdd falls to, for example, about 0.9V.

Figure 5A:
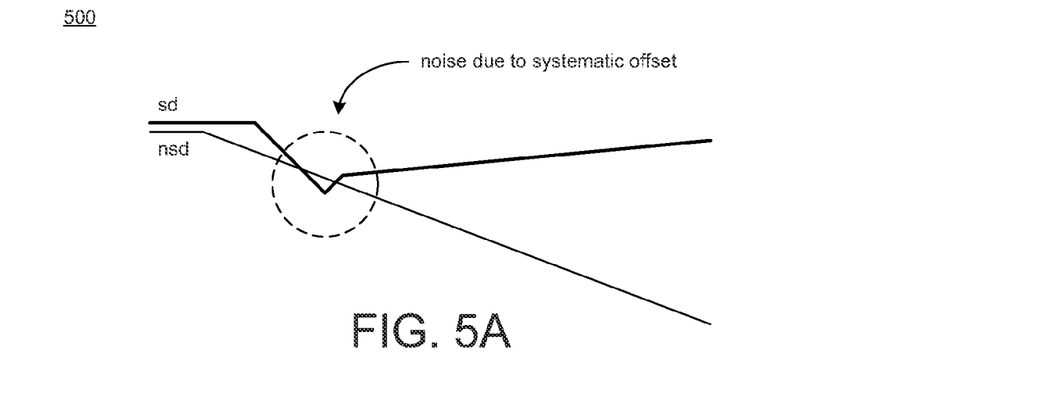
Figure 5B:
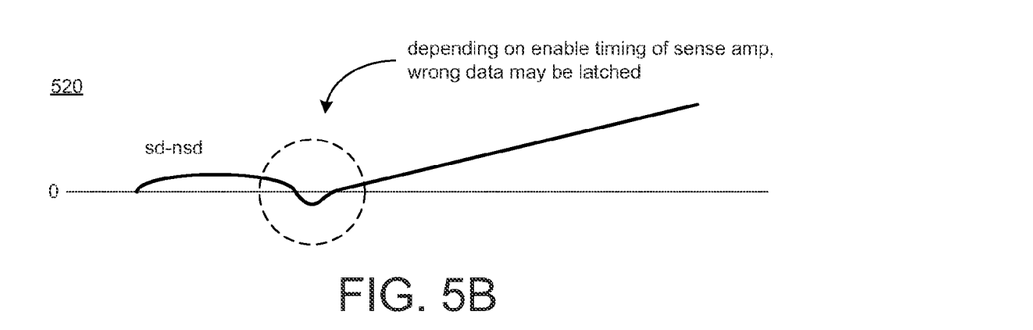
Figure 5C:
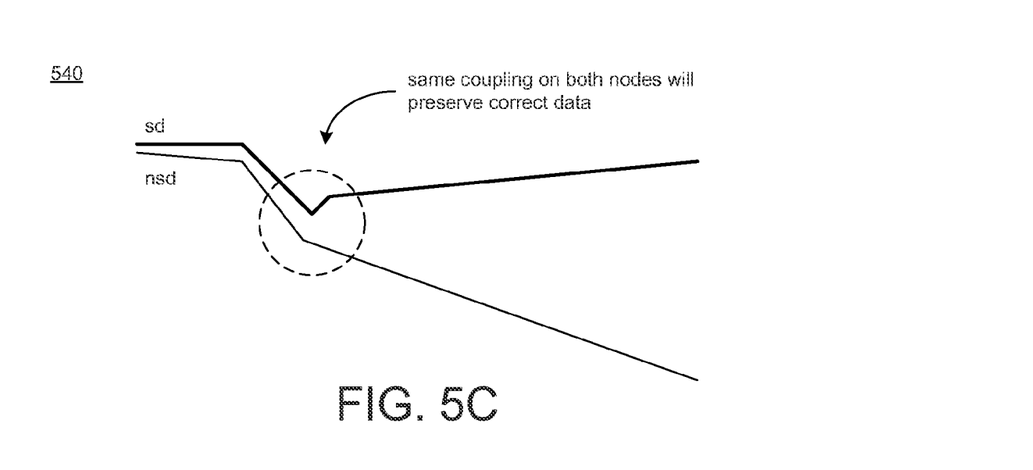

FIGS. 5A-5C illustrate effects on node voltages during a read in accordance with various implementations described herein. In particular, FIG. 5A shows effects of noise on the first and second sensed data signals sd, nsd due to systematic offset. As shown in FIG. 5A, systematic offset may create a situation where there is crossover between the first and second sensed data signals sd, nsd, and in this scenario, wrong data may be latched at the output (out). For instance, as shown in FIG. 5B, depending on the timing of the enable signal (en) as provided by the sense amplifier, incorrect or wrong data may be latched. However, in accordance with various implementations, as described herein, FIG. 5C shows that a same (or at least similar) capacitance coupling on both nodes sd, nsd may (or will) preserve correct data latched at the output (out).

Figure 6:
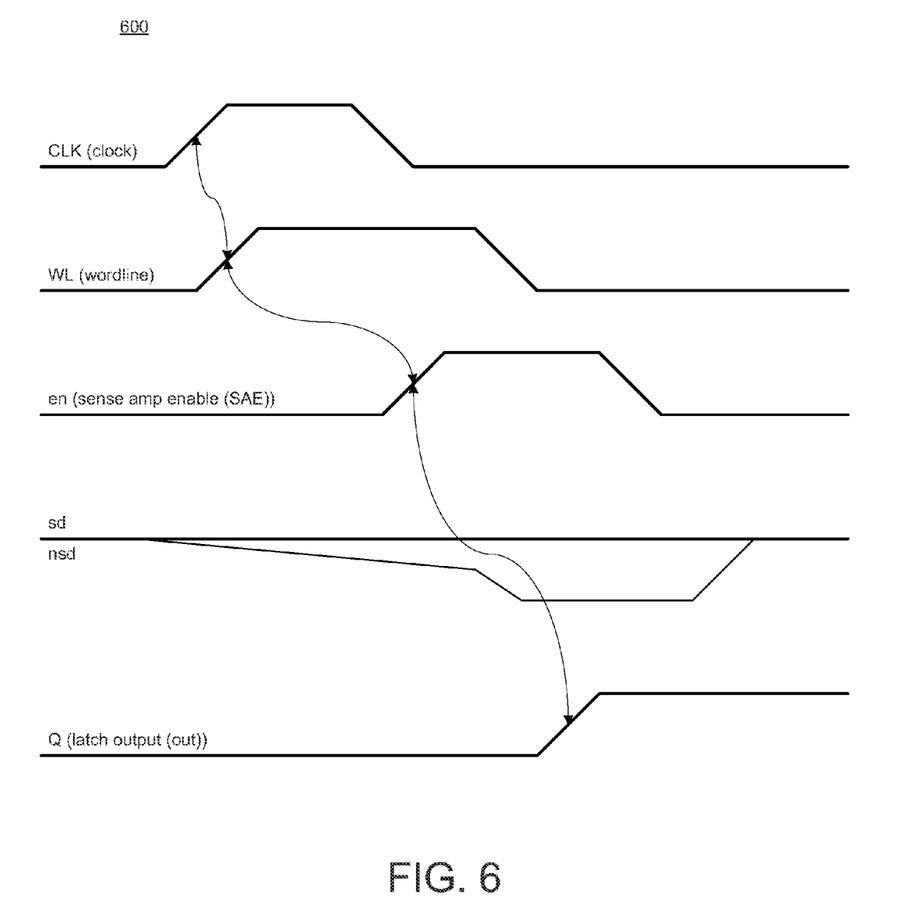

Accordingly, various implementations described herein refer to techniques to reduce systematic offset in latch based differential sense amplifier circuitry by dynamic capacitance balancing to thereby improve power, performance, and area (PPA). For the memory cell (e.g., SRAM) that may use a differential sense amplifier, mismatch of the amplifier capacitance may be considered a critical parameter. Hence, the sense amplifier should be enabled only after sufficient voltage difference is generated across two ends of the sense amplifier to then read correct data. This also plays a role in determining access time and cycle time of memory. As shown in FIG. 6, the sense amplifier may be enabled only when sufficient voltage difference is available at differential inputs.

In this scenario, sense amplifier offset may refer to combination of two different types of mismatch, random (which may be determined by local variation in sense amplifier voltage pull downs) and systematic. Generally, systematic offset may refer to a function of mismatch between capacitance of differential inputs/output of the sense amplifier. In a typical sense amplifier, one input (e.g., B) may be used to latch amplified data while a compliment input (e.g., $\overline{B}$) may be used as a dummy node. Conventionally, dummy node is connected to a dummy latch with a floating output. This dummy latch is typically the same size as a standard latch to provide better capacitance matching in static condition. However, as described herein in reference to FIG. 2, use of this dummy latch may be inefficient due the increased area by incorporating the dummy latch. As such, improvements to this type of configuration are described in greater detail herein.

Figure 7:
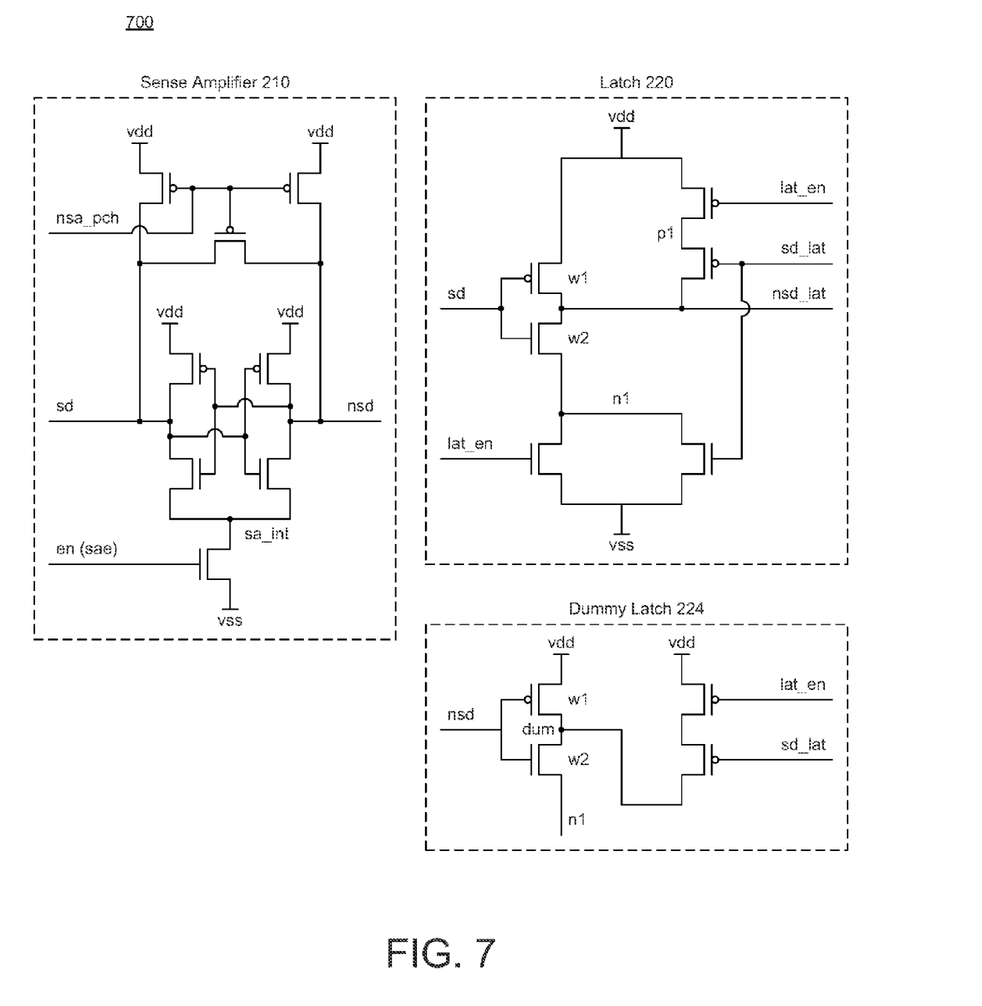

FIG. 7 illustrates a schematic diagram 700 of more detailed portions of the sense amplifier circuit 200 of FIG. 2 (e.g., the latch 220 and the dummy latch 224) in accordance with various implementations described herein. As shown in FIG. 7, the sense amplifier circuit 200 of FIG. 2 may be implemented as an integrated circuit with multiple stages and with multiple circuit components, such as, e.g., multiple transistors arranged to perform the various techniques described herein. Further, as previously described herein, the multiple stages may be referred to as multiple sub-divided circuits or circuit portions having interdependent relationships.

In some implementations, the sense amplifier 213 may refer to a voltage based differential sense amplifier having latch node (nsd_lat) and dummy latch node (dum), as shown in FIG. 7. Even though capacitance mismatch between sd and nsd may be within 2%, the dynamic coupling from nsd_lat→sd and dum→nsd differs significantly depending on the data value (e.g., 0 or 1) to be read, which may already be stored in the latch 220. As described herein, this may result in larger systematic offset. Further, this may be avoided by increasing capacitance on the dummy node (dum) such that impact of dynamic capacitance is less. However, this configuration is typically not area efficient, and total dynamic imbalance may not be removed or cancelled.

Figure 8:
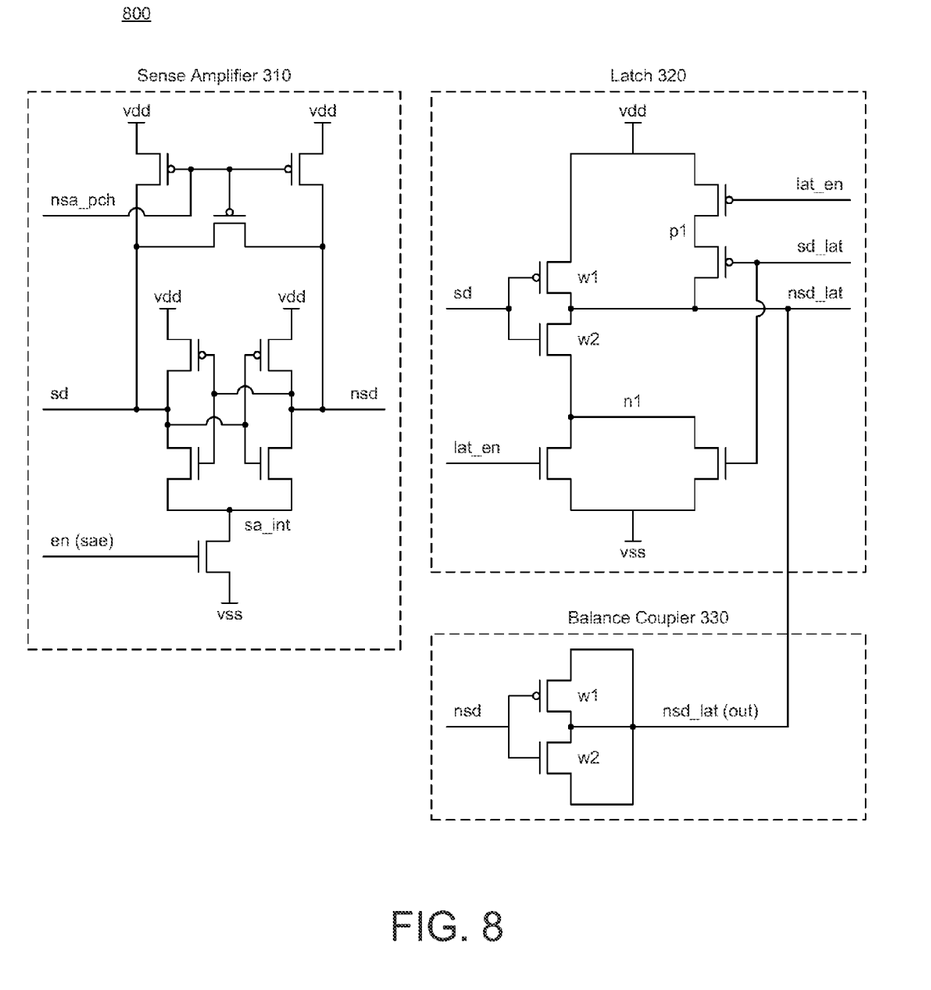

FIG. 8 illustrates a schematic diagram 800 of more detailed portions of the sense amplifier circuit 300 of FIG. 3 (e.g., the latch 320 and the balance coupler 330) in accordance with various implementations described herein. As shown in FIG. 8, the sense amplifier circuit 300 of FIG. 3 may be implemented as an integrated circuit with multiple stages and with multiple circuit components, such as, e.g., multiple transistors arranged to perform the various techniques as described herein. Further, as previously described herein, the multiple stages may be referred to as multiple sub-divided circuits or circuit portions having interdependent relationships.

In reference to FIG. 8, the sense amplifier circuit 300 may be referred to as a systematic offset reduction circuit. As shown in FIG. 8, the sense amplifier circuit 300 may include sense amplifier 310 having a first plurality of transistors arranged to provide a first sensed data signal sd and provide a second sensed data signal nsd that is a compliment of the first sensed data signal. Further, the balance coupler 330 may include a second plurality of transistors arranged to receive the second sensed data signal from the first plurality of transistors and provide an adjusted second sensed data signal nsd_lat having capacitance similar to the first sensed data signal sd. Still further, the latch 320 may include a third plurality of transistors arranged to receive the first sensed data signal sd from the first plurality of transistors, receive the adjusted second sensed data signal nsd_lat from the second plurality of transistors, and provide an output signal based on the first sensed data signal sd and the adjusted second sensed data signal nsd_lat.

In some implementations, the second plurality of transistors of the balance coupler 330 may be arranged to increase capacitance of the second sensed data signal nsd and provide the adjusted second sensed data signal nsd_lat with capacitance similar to the first sensed data signal sd. Further, in some implementations, the second plurality of transistors of the balance coupler 330 may be arranged to compensate for dynamic capacitance imbalance between the first and second sensed data signals sd, nsd by replicating Miller capacitance coupling effects of the first sensed data signal sd to the second sensed data signal nsd.

In this scheme, the dummy latch 224 may be replaced with the balance coupler 330, which may be modeled as a capacitor with a gate node connected to nsd. Further, an output node (out) of this modelled capacitor may be connected to the latch output node (nsd_lat). As such, in some cases, this may ensure a same (or at least similar) dynamic capacitance environment on both sd and nsd nodes in reference to latch node (nsd_lat). Hence, dynamic capacitance imbalance may be removed or cancelled.

In the implementation of FIG. 8, the balance coupler 330 may include PMOS transistor w1 (corresponding to PMOS transistor w1 of the latch 320) and NMOS transistor w2 (corresponding to NMOS transistor w2 of the latch 320). In reference to the balance coupler 330, the nsd signal may be coupled to each gate of PMOS transistor w1 and NMOS transistor w2, which are coupled as a capacitor and coupled to the latch node (nsd_lat) of latch 320. Similarly, in reference to the latch 320, the sd signal may be coupled to each gate of PMOS transistor w1 and NMOS transistor w2, which are both coupled to latch node (nsd_lat) of latch 320. In some implementations, after this fix, systematic offset in, e.g., a single port register file may be reduced by ~9 mV, which may result in 20 ps gain in timing without any impact (or at least less impact) on area and/or power.

Figure 9:
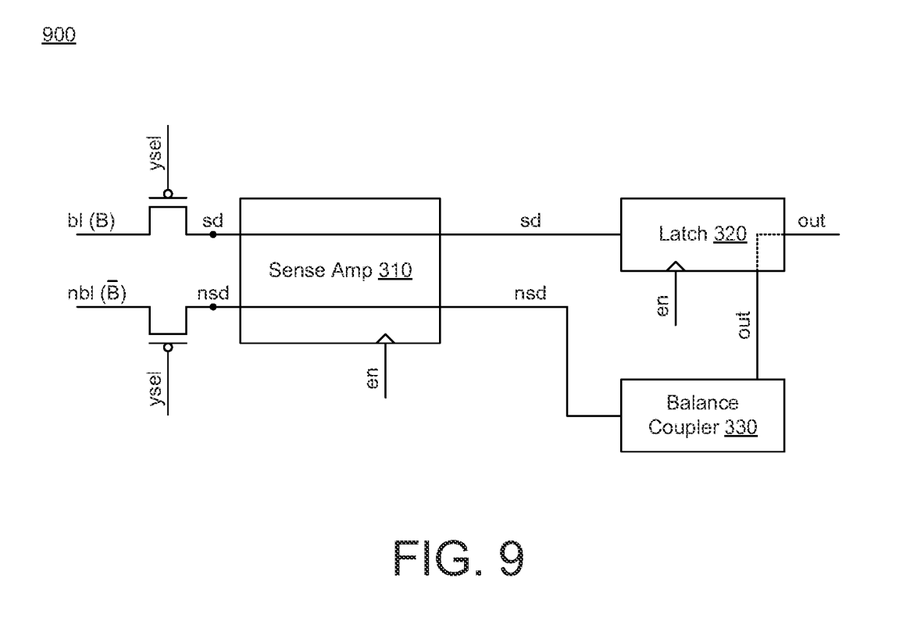
Figure 10A:
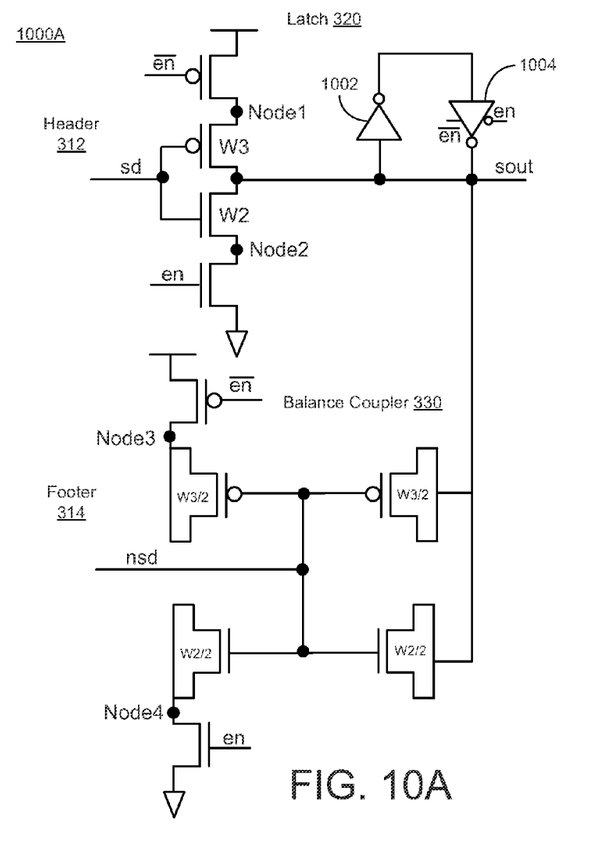
Figure 10B:
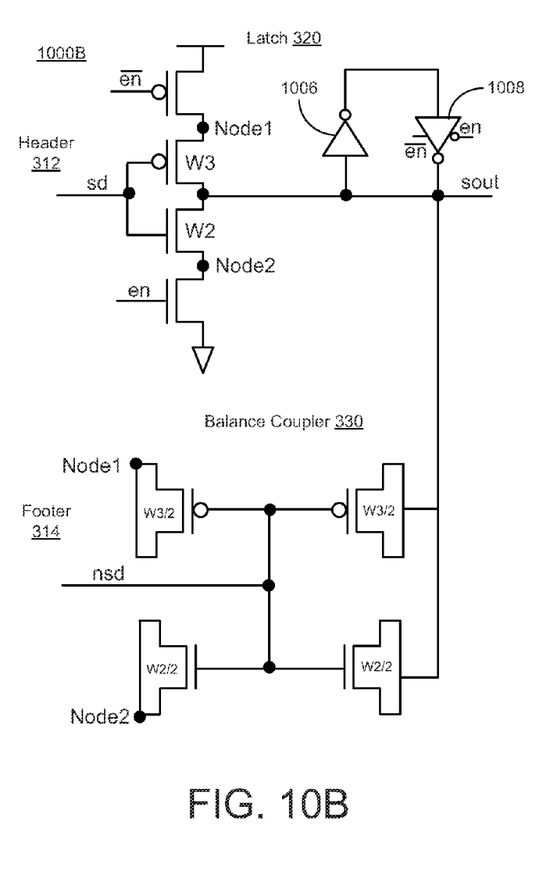

FIGS. 9-10B illustrate an alternate of sense amplifier circuit 300 of FIG. 3 in accordance with various implementations described herein. In particular, FIG. 9 illustrates a schematic diagram 900 of more detailed portions of sense amplifier circuit 300 of FIG. 3 (e.g., sense amplifier 310, latch 320, and balance coupler 330) in accordance with various implementations described herein. FIG. 10A illustrates another schematic diagram 1000A of more detailed portions of sense amplifier circuit 300 of FIG. 3 (e.g., latch 320 and balance coupler 330) in accordance with the various implementations described herein. FIG. 10B illustrates still another schematic diagram 1000B of more detailed portions of sense amplifier circuit 300 of FIG. 3 (e.g., latch 320 and balance coupler 330) in accordance with the various implementations described herein. Further, the diagram 400 of FIG. 4 may also be used in reference to the subsequent discussion.

As shown in FIGS. 9-10B, the sense amplifier circuit 300 of FIG. 3 may be implemented as an integrated circuit with multiple stages and multiple circuit components, such as, e.g., multiple transistors arranged to perform the various techniques as described herein. Further, as previously described, multiple stages may be referred to as multiple sub-divided circuits or circuit portions having interdependent relationships.

In some implementations, as shown in FIG. 9, the sense amplifier 310 may include a column mux (multiplexor) and a single-ended latch 320 with the balance coupler 330. As shown in FIGS. 10A-10B, nodes may be shared. For instance, as shown in FIGS. 10A-10B, Node 1, Node 2, Node 3, and Node 4 may be common to each of the latch 320 and the balance coupler 330. Further, as shown in FIGS. 10A-10B, latch 320 and balance coupler 330 may refer to a header portion 312 and a footer portion 314, respectively, that may be separate circuits or circuit portions. Generally, various implementations described herein are configured to match Miller capacitance between the sense amplifier output node (sout) and Nodes 1 and 2. For instance, in the tristate driver of the latch 320, Node 1, Node 3 and Node 2, Node 4 are equivalent (or at least similar). These may be implemented using the different transistors, as shown in FIGS. 10A, 10B. Further, similar nodes may be shared, as shown in FIGS. 10A, 10B, by metal coupling wires.

In some implementations, the latch 320 of FIG. 10A may include one or more logic devices 1002, 1004 (e.g., one or more inverters or similar logic devices) arranged in parallel with the output path (out or sout). Similarly, the latch 320 of FIG. 10B may include one or more logic devices 1006, 1008 (e.g., one or more inverters or similar logic devices) arranged in parallel with the output path (out or sout).

Described herein are various implementations of an integrated circuit. In one implementation, the integrated circuit may include a device having a sense amplifier coupled to complimentary bitlines. The sense amplifier may be configured to receive complimentary data signals from the complimentary bitlines and provide first and second sensed data signals based on the received complimentary data signals. The second sensed data signal may be a compliment of the first sensed data signal. The device may include a balance coupler coupled to the sense amplifier and configured to receive the second sensed data signal from the sense amplifier and provide a modified second sensed data signal having capacitance similar to the first sensed data signal. The device may include a latch coupled to the sense amplifier and the balance coupler. The latch may be configured to receive the first sensed data signal from the sense amplifier, receive the modified second sensed data signal from the balance coupler, and provide a latched data signal based on the first and modified second sensed data signals.

Described herein are various implementations of an integrated circuit. In one implementation, the integrated circuit may include a sense amplifying portion configured to receive first and second data signals from complimentary bitlines, provide a first sensed data signal based on the first received data signal, and provide a second sensed data signal that is a compliment of the first sensed data signal based on the second received data signal. The integrated circuit may include a balance coupling portion configured to receive the second sensed data signal from the sense amplifying portion and provide a balanced second sensed data signal with capacitance matched to the first sensed data signal. The integrated circuit may include a latching portion configured to receive the first sensed data signal from the sense amplifying portion, receive the balanced second sensed data signal from the balance coupling portion, and provide an output data signal based on the first sensed data signal and the balanced second sensed data signal.

Described herein are various implementations of a systematic offset reduction circuit. In one implementation, the systematic offset reduction circuit may include a first plurality of transistors arranged to receive complimentary data signals from a memory cell via complimentary bitlines, provide a first sensed data signal based on a first received data signal, and provide a second sensed data signal that is a compliment of the first sensed data signal based on a second received data signal. The systematic offset reduction circuit may include a second plurality of transistors arranged to receive the second sensed data signal from the first plurality of transistors and provide an adjusted second sensed data signal having capacitance similar to the first sensed data signal. The systematic offset reduction circuit may include a third plurality of transistors arranged to receive the first sensed data signal from the first plurality of transistors, receive the adjusted second sensed data signal from the second plurality of transistors, and provide an output data signal based on the first sensed data signal and the adjusted second sensed data signal.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments. Further, circuits and/or circuitry may refer to devices, apparatuses, components, portions, parts, etc. as may be applied to the various implementations described herein.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting

[the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   a sense amplifier coupled to complimentary bitlines, wherein the sense amplifier is configured to receive complimentary data signals from the complimentary bitlines and provide first and second sensed data signals based on the received complimentary data signals, and wherein the second sensed data signal is a compliment of the first sensed data signal;
   a balance coupler coupled to the sense amplifier and configured to receive the second sensed data signal from the sense amplifier and provide a modified second sensed data signal having capacitance similar to the first sensed data signal; and
   a latch coupled to the sense amplifier and the balance coupler, wherein the latch is configured to receive the first sensed data signal from the sense amplifier, receive the modified second sensed data signal from the balance coupler, and provide a latched data signal based on the first and modified second sensed data signals.

2. The device of claim 1, wherein the sense amplifier is coupled to a memory cell and is configured to receive the complimentary data signals from the memory cell via the complimentary bitlines, and wherein the complimentary data signals represent data bit values stored in the memory cell.

3. The device of claim 2, wherein the memory cell comprises static random access memory (SRAM).

4. The device of claim 1, wherein the complimentary data signals comprise a first complimentary data signal representing a data bit value and a second complimentary data signal representing a compliment of the data bit value.

5. The device of claim 1, wherein the sense amplifier is configured to provide an enable signal to the latch, and wherein the latch is configured to receive the enable signal from the sense amplifier.

6. The device of claim 1, wherein the sense amplifier comprises a differential sense amplifier having differential inputs, and wherein the sense amplifier is enabled only when a sufficient voltage difference is available at the differential inputs.

7. The device of claim 6, wherein the balance coupler is configured to compensate for systematic offset due to capacitance mismatch between the differential inputs of the complimentary data signals by providing capacitance matching between the differential inputs of the complimentary data signals.

8. The device of claim 7, wherein systematic offset is a function of mismatch between capacitance of the differential inputs of the sense amplifier.

9. The device of claim 1, wherein the balance coupler is configured to adjust the capacitance of the second sensed data signal and provide the modified second sensed data signal with capacitance similar to the first sensed data signal.

10. The device of claim 1, wherein the balance coupler is configured to compensate for dynamic capacitance imbalance between the first and second sensed data signals by replicating Miller capacitance effects of the first sensed data signal to the second sensed data signal.

11. The device of claim 1, wherein the balance coupler comprises multiple transistors arranged as one or more capacitors.

12. The device of claim 1, wherein the balance coupler comprises multiple transistors arranged to receive the second sensed data signal and balance the capacitance of the second sensed data signal to match the capacitance of the first sensed data signal so as to provide the modified second sensed data signal with capacitance similar to the first sensed data signal.

13. The device of claim 1, wherein the latch comprises a dual input and single output.

14. An integrated circuit, comprising:
   a sense amplifying portion configured to receive first and second data signals from complimentary bitlines, provide a first sensed data signal based on the first received data signal, and provide a second sensed data signal that is a compliment of the first sensed data signal based on the second received data signal;
   a balance coupling portion configured to receive the second sensed data signal from the sense amplifying portion and provide a balanced second sensed data signal with capacitance matched to the first sensed data signal; and
   a latching portion configured to receive the first sensed data signal from the sense amplifying portion, receive the balanced second sensed data signal from the balance coupling portion, and provide an output data signal based on the first sensed data signal and the balanced second sensed data signal.

15. The integrated circuit of claim 14, wherein the sense amplifying portion comprises multiple transistors arranged as a differential sense amplifier with differential inputs, and wherein the sense amplifying portion is enabled only when a sufficient voltage difference is available at the differential inputs.

16. The integrated circuit of claim 15, wherein the balance coupling portion comprises multiple transistors arranged to compensate for systematic offset due to capacitance mismatch between the differential inputs of the complimentary data signals by providing capacitance matching between the differential inputs of the complimentary data signals.

17. The integrated circuit of claim 16, wherein the multiple transistors are arranged as one or more capacitors.

18. A systematic offset reduction circuit, comprising:
   a first plurality of transistors arranged to receive complimentary data signals from a memory cell via complimentary bitlines, provide a first sensed data signal based on a first received data signal, and provide a second sensed data signal that is a compliment of the first sensed data signal based on a second received data signal;
   a second plurality of transistors arranged to receive the second sensed data signal from the first plurality of transistors and provide an adjusted second sensed data signal having capacitance similar to the first sensed data signal; and a third plurality of transistors arranged to receive the first sensed data signal from the first plurality of transistors, receive the adjusted second sensed data signal from the second plurality of transistors, and provide an output data signal based on the first sensed data signal and the adjusted second sensed data signal.

19. The circuit of claim 18, wherein the second plurality of transistors are arranged to increase capacitance of the second sensed data signal and provide the adjusted second sensed data signal with capacitance similar to the first sensed data signal.

20. The circuit of claim 18, wherein the second plurality of transistors are arranged to compensate for dynamic capacitance imbalance between the first and second sensed data signals by replicating Miller capacitance effects of the first sensed data signal to the second sensed data signal.

* * * * *